(12) United States Patent
Fantini et al.

(10) Patent No.: US 10,546,636 B2
(45) Date of Patent: Jan. 28, 2020

(54) APPARATUSES AND METHODS FOR ACCESSING VARIABLE RESISTANCE MEMORY DEVICE

(71) Applicant: Micron Technology, Inc., Boise, ID (US)

(72) Inventors: Paolo Fantini, Vimercati (IT); Daniele Ielmini, Bergamo (IT); Nicola Ciocchini, Talamona (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/971,723

(22) Filed: May 4, 2018

(65) Prior Publication Data

US 2018/0261284 A1    Sep. 13, 2018

Related U.S. Application Data

(63) Continuation of application No. 14/535,099, filed on Nov. 6, 2014, now Pat. No. 9,990,990.

(51) Int. Cl.
*G11C 13/00* (2006.01)

(52) U.S. Cl.
CPC ........ *G11C 13/003* (2013.01); *G11C 13/0004* (2013.01); *G11C 13/0069* (2013.01); *G11C 2013/0073* (2013.01); *G11C 2013/0092* (2013.01); *G11C 2213/76* (2013.01)

(58) Field of Classification Search
CPC ............. G11C 13/003; G11C 13/0004; G11C 13/0069; G11C 2013/0073
USPC ......................................................... 365/148
See application file for complete search history.

(56) References Cited

U.S. PATENT DOCUMENTS

| | | | |
|---|---|---|---|
| 7,443,721 B2 | 10/2008 | Kurotsuchi et al. | |
| 8,077,505 B2 | 12/2011 | Chen et al. | |
| 8,107,283 B2 | 1/2012 | Chen | |
| 8,866,121 B2 | 10/2014 | Wang et al. | |
| 8,958,233 B2 | 2/2015 | Chen | |
| 9,312,005 B2 | 4/2016 | Castro | |
| 9,324,423 B2 | 4/2016 | Castro | |
| 9,437,266 B2 | 9/2016 | Lee et al. | |
| 9,613,690 B2 | 4/2017 | Park et al. | |
| 2008/0062740 A1* | 3/2008 | Baek .................. | G11C 13/0007 365/148 |
| 2012/0211719 A1* | 8/2012 | Haimoto ............... | H01L 45/085 257/4 |
| 2013/0026438 A1* | 1/2013 | Wang .................. | H01L 45/1233 257/4 |
| 2016/0133319 A1 | 5/2016 | Fantini et al. | |

* cited by examiner

*Primary Examiner* — Anthan Tran
(74) *Attorney, Agent, or Firm* — Holland & Hart LLP

(57) ABSTRACT

The disclosed technology generally relates to memory apparatuses and methods of operating the same, and more particularly to a memory device having a controller configured to cause a write operation to be performed on a variable resistance memory cell, which includes application of two successive access pulses having opposite polarities, and methods of using the same.

17 Claims, 7 Drawing Sheets

APPARATUSES AND METHODS FOR ACCESSING VARIABLE RESISTANCE MEMORY DEVICE

CROSS REFERENCE

The present Application for Patent claims priority to and is a continuation of U.S. patent application Ser. No. 14/535,099 by Fantini et al., entitled "Apparatuses and Methods for Accessing Variable Resistance Memory Device," filed Nov. 6, 2014, now U.S. Pat. No. 9,990,990, issued Jun. 5, 2018, assigned to the assignee hereof, and is expressly incorporated by reference herein.

BACKGROUND

Field

The disclosed technology generally relates to memory apparatuses and methods of operating the same, and more particularly to a memory device having a controller configured to cause an access operation on a variable resistance memory cell.

Description of the Related Art

In some memory apparatuses, determination of the state (e.g., a programmed state or an erased state) of a memory cell can be based on a threshold voltage and/or a read current associated with the state. For some applications, it may be desirable to have a relatively large read voltage or current window for reading the state of the memory cell. In addition, it may be desirable to have relatively stable threshold voltage and/or read current values of the programmed and/or erased memory cells over time. Thus, there is a need for apparatuses and methods of increasing the read window and/or improving the stability of the threshold voltage/read current.

DETAILED DESCRIPTION OF THE PREFERRED EMBODIMENT

Figure 1:
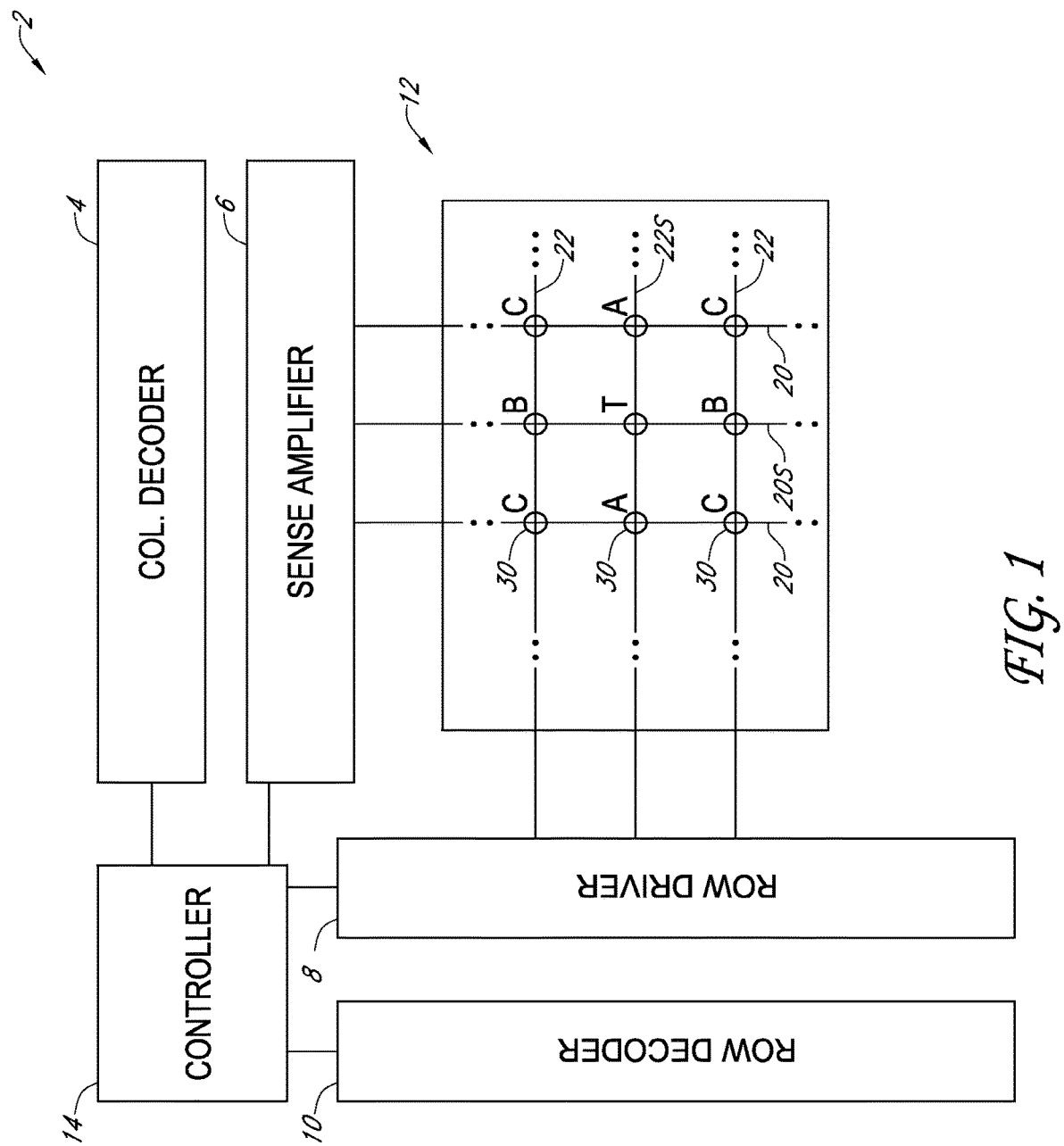
FIG. 1 is a schematic circuit block diagram of a memory device according to one embodiment.

Some memory apparatuses have a controller configured to cause an access operation, such as a write operation, on a memory cell, e.g., a variable resistance memory cell, within a memory array. Such an access operation can change the state of the memory cell from one state (e.g., a programmed state or an erased state) to another state (e.g., an erased state or a programmed state). In some memory apparatuses, the determination of the state of the memory cell can be based on a threshold voltage and/or a read current associated with the state of the memory cell. For some applications, it may be desirable to have a relatively large difference in read voltage or read current between different states of a memory cell reading. In addition, it may be desirable to have relatively stable threshold voltage and/or read current values of the programmed and/or erased memory cells over time. Furthermore, it may sometimes be desirable to obtain the relatively large read window and/or the stability of the threshold voltage/read current for a given memory cell configuration via optimization of an access operation, e.g., through write (program or erase) access pulses. Thus, there is a need for improving the read window and/or improving the stability of the threshold voltage/read current of a memory cell via optimized access operations.

As used herein, a write access operation can be a program or an erase operation. For a variable resistance memory cell, a program operation can also be referred to as a RESET operation, which can change the resistance state of the memory cell from a relatively low resistance state to a relatively high resistance state. Similarly, an erase operation, which for a variable resistance memory can also be referred to as a SET operation, can change the resistance state of the memory cell from a relatively high resistance state to a relatively low resistance state. It will be understood that the above terminology is arbitrary but conventional for referring to write operations for applying different memory states on variable resistance memory cells.

In addition, while SET and RESET states may herein be used to refer to states corresponding to a memory cell in general, when the memory cell includes a storage element and a selector element where the selector element does not undergo a stable change in resistance, it will be understood that the distinction between SET and RESET states of the memory cell originate from the resistance difference of the storage element.

In some embodiments, SET and RESET states may correspond to the "1" state and a "0" state, respectively, in a single bit-per-cell memory system. However, the states "1" and "0" as they relate to high and low resistance states may be used interchangeably to mean the opposite. In other embodiments, there may be more than two resistance states. For example, a memory cell can have four states, e.g., first, second, third, and fourth resistance states that may correspond to the "00," "01," "10", and "11" states in a two bits-per-cell memory system. Yet other embodiments are possible, where first through eighth resistance states represent the states in a three-bits-per cell memory system, and where first through sixteenth resistance states represent the states in a four-bits-per cell memory system.

FIG. 1 schematically illustrates a circuit block diagram of a memory device 2 according to some embodiments. The memory device 2 includes a memory array 12 which comprises a plurality of columns 20 and a plurality of rows 22. The memory array 12 additionally comprises a plurality of memory cells 30 at each crossing between a column 20 and a row 22. By convention, the columns 20 may also be referred to as digit lines, particularly as bit lines, and rows 22 may also be referred to as word lines.

The memory device 2 additionally includes a column decoder 4 electrically connected to the columns 20 and a row decoder 10 electrically connected to the rows 22 according to some embodiments.

The memory device 2 additionally includes a row driver 8, which can be a word line driver, electrically connected to the rows 22, and a sense amplifier 6 electrically connected to the columns 20. During an access operation, one of the rows 22 and one or more of the columns 20 specified by an address in a command are activated.

Still referring to FIG. 1, in some embodiments, the memory array 10 is further connected to a memory controller 14 configured to control the various access operations on the memory array 12, including write and read operations. In operation, the memory controller 14 configured to receive signals from a processor to access one or more memory cells 30 in the memory array 12. The controller 14 is in turn configured to transmit a memory access command to the memory array 12 through the column decoder 4 and the row decoder 10. A physical address of a memory cell 30 to be accessed may be specified by a memory cell address included in the memory access command. The memory cell address can include a column address and/or a row address corresponding to the column and the row to be activated (column 20S and row 22S in FIG. 1) in order to access a target memory cell (T cell in FIG. 1). Upon receiving the memory cell address, the column decoder 4 is configured to decode a column address and select a column to be activated and the row decoder 10 is similarly configured to decode a row address and select a row to be activated. When the access operation is a write operation, the memory controller 14, by causing activation of a selected column and/or a selected row, is configured to cause a state change of the memory cell 30.

In operation, the memory cells 30 of memory array 10 can be categorized based on different biases the memory cells 30 receive. The target cell T is located at an intersection between the selected column 20S and the selected row 22S. In addition, memory cells along the selected column 20 that are inhibited by unselected rows are labeled as B cells, while memory cells along the selected row 22 that are inhibited by unselected columns are labeled as A cells. The remaining cells at intersections of unselected rows and columns are labeled as C cells. The relative biases the different cells may receive according to embodiments will be described more in detail in the following, e.g., in reference to FIG. 4.

Figure 2:
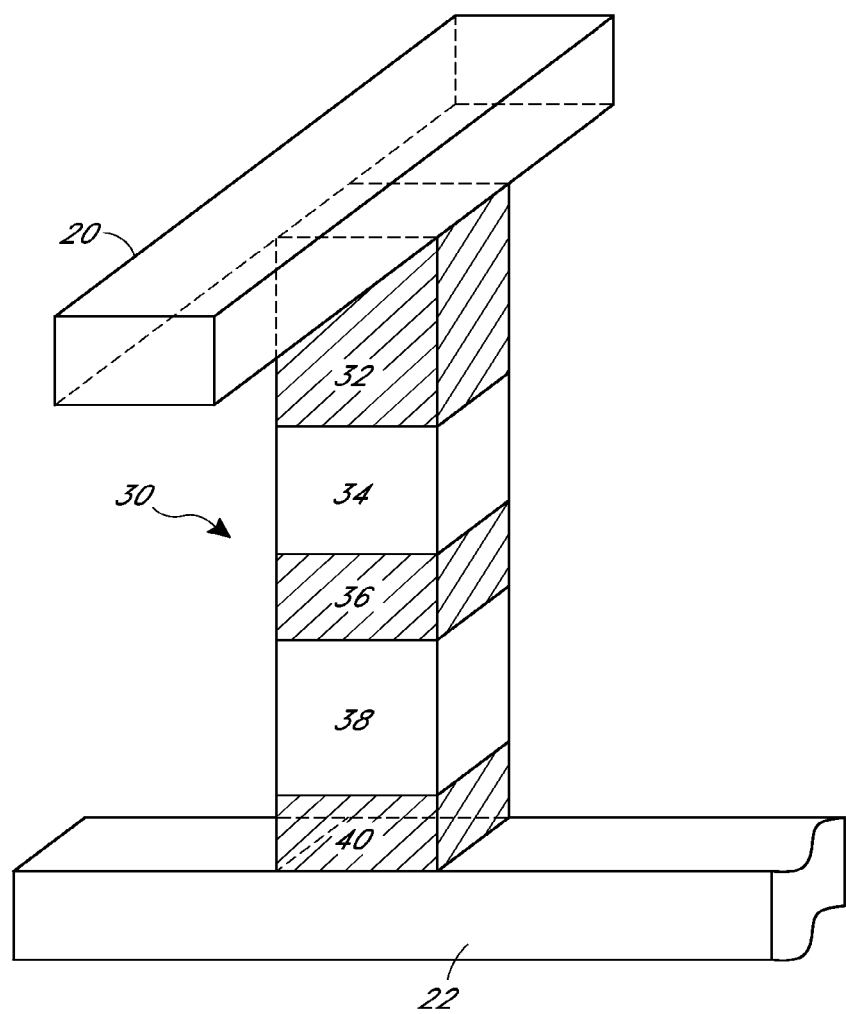
FIG. 2 is a schematic three-dimensional isometric view depicting a memory cell according to some embodiments.

FIG. 2 depicts a memory cell 30 in a cross-point memory array similar to the memory array 12 described above with respect to FIG. 1, according to some embodiments. The memory cell 30 in FIG. 2 is a variable resistance memory cell and can change between first and second resistance states in response to electrical signals. While only one memory cell 30 is depicted in FIG. 2 for clarity, it will be appreciated that there can be a plurality of memory cells 30 in a cross-point memory array having a plurality of column lines 20 and a plurality of row lines 22. In the illustrated embodiment, the memory cell 10 includes a storage element 34 and a selector element 38 that are configured to be electrically accessed through a column line 20, which can be a digit line, and a row line 22, which can be a word line. The memory cell 30 is in a stack configuration and can further include a first electrode 32 connecting the column line 20 and the storage element 34, a middle electrode 36 connecting the storage element 34 and the selector element 38, and a second electrode 40 connecting the selector element 38 and the row line 22.

In some embodiments, one or both of the selector element 38 and the storage element 34 can comprise chalcogenide materials. When both the selector element 38 and the storage element 34 comprise chalcogenide materials, the storage element 34 can comprise a chalcogenide material that can undergo a phase change that is stable and nonvolatile at room temperature. On the other hand, the selector element 38 can comprise a chalcogenide material that does not undergo a similar stable and nonvolatile phase change. When the storage element 34 includes a chalcogenide material, the variable resistance memory cell 30 may be referred to as a phase change memory cell.

Examples of chalcogenide materials included in the storage element 34 include chalcogenide compositions such as an alloy including at least two of the elements within the indium(In)-antimony(Sb)-tellurium(Te) (IST) alloy system, for example, In2Sb2re5, IniSb2re4, IniSb4Te7, etc., or an alloy including at least two of the elements within the germanium(Ge)-antimony(Sb)-tellurium(Te) (GST) alloy system, for example, $Ge_8Sb_5Te_8$, $Ge_2Sb_2Te_5$, $Ge_1Sb_2Te_4$, $Ge_1Sb_4Te_7$, $Ge_4Sb_4Te_7$, etc. Other chalcogenide alloy systems that can be included in the storage element 34 include Ge—Te, In—Se, Sb—Te, Ga—Sb, In—Sb, As—Te, Al—Te, In—Ge—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, for example. The hyphenated chemical composition notation, as used herein, indicates the elements included in a particular mixture or compound, and is not intended to represent a particular stoichiometry involving the indicated elements.

Examples of chalcogenide-based selector element 38 includes a two terminal selector comprising a chalcogenide material, which is sometimes referred to as an Ovonic Threshold Switch (OTS). An OTS may include a chalcogenide composition including any one of the chalcogenide alloy systems described above for the storage element 34. In addition, the selector element 38 may further comprise an element such as As to suppress crystallization. Examples of OTS materials include Te—As—Ge—Si, Ge—Te—Pb, Ge—Se—Te, Al—As—Te, Se—As—Ge—Si, Se—As—Ge—C, Se—Te—Ge—Si, Ge—Sb—Te—Se, Ge—Bi—Te—Se, Ge—As—Sb—Se, Ge—As—Bi—Te, and Ge—As—Bi—Se, among others.

Examples of non-chalcogenide-based selector elements include a two terminal device (e.g., a switch), such as a diode, an ovonic threshold switch (OTS), a tunnel junction, or a mixed ionic electronic conduction switch (MIEC), among other two terminal devices. Alternatively, examples of the selector element include a three terminal device (e.g., a switch), such as a field effect transistor (FET) or a bipolar junction transistor (BJT), among other switching elements.

Still referring to FIG. 2, the memory cell 30 may be in a resistance state that may be a relatively high resistance state (HRS), also known as the RESET state, or a relatively low resistance state (LRS), also known as the SET state. The RESET and SET states can have a resistance ratio between, for example, two and 1 million.

In addition, while SET and RESET states may herein be used to refer to states of a memory cell (which may include storage and/or selector elements) as a whole, it will be understood that the distinction between SET and RESET states of the memory cell can originate from the resistance difference of the storage element.

As described above, in some embodiments, the memory cell 30 may be a phase change memory (PCM) cell. A RESET operation in a PCM cell can be performed, for example, by applying a RESET voltage or current pulse sufficient to melt at least a portion of a storage element comprising a chalcogenide material and quenching, such that at least a portion of the memory element becomes quenched-in in an amorphous phase. In addition, a SET operation in a PCM cell can be performed, for example, by applying a SET current sufficient to crystallize enough of a memory element comprising the chalcogenide material, such that its lower resistance state is distinguishable in a read operation from the higher resistance, more amorphous state (RESET state). For example, after a SET operation, a majority of the memory element material may be crystalline.

The inventors have found that, under some circumstances, one or more elements within either or both of the storage element 34 and the selector element 38 can migrate over time and/or write cycles. For example, without being bound to any theory, Te atoms that may be present in either or both of the storage element 34 and the selector element 38 may migrate towards a positively biased electrode, e.g., the top electrode, while Ge and/or Sb atoms that may be present in either or both of the storage element 34 and/or the selector element 38 gradually migrate towards a negatively biased electrode, e.g., the bottom electrode. Such migration may be localized within the storage or selector elements or extend beyond the storage or selector elements. Such migration can cause local compositions to change, resulting in degradation of various performance metrics the memory cells. Examples of degradations include changes in threshold voltage window over time, cycling endurance failures, and catastrophic electrical open circuiting caused by void formation within the memory cell from electromigration, to name a few. Furthermore, without being bound to any theory, the inventors have found that such migration may be more pronounced during a RESET access operation, during which the temperature of the memory cell 30 may reach a higher temperature compared to other access operations such as SET and READ operations, and during which at least portions of the storage element 34 may at least temporarily melt, resulting in relatively faster diffusion of the migrating elements. To mitigate the detrimental effects of atom migration within the memory cell 30 as described above, the inventors have found it advantageous to use a dual-pulse, including opposite polarity pulses, during an access operation on a variable resistance memory cell, such as a phase change memory. Thus, in the following, an apparatus and a method is described, in which a dual-pulse access is implemented.

Figure 3B:
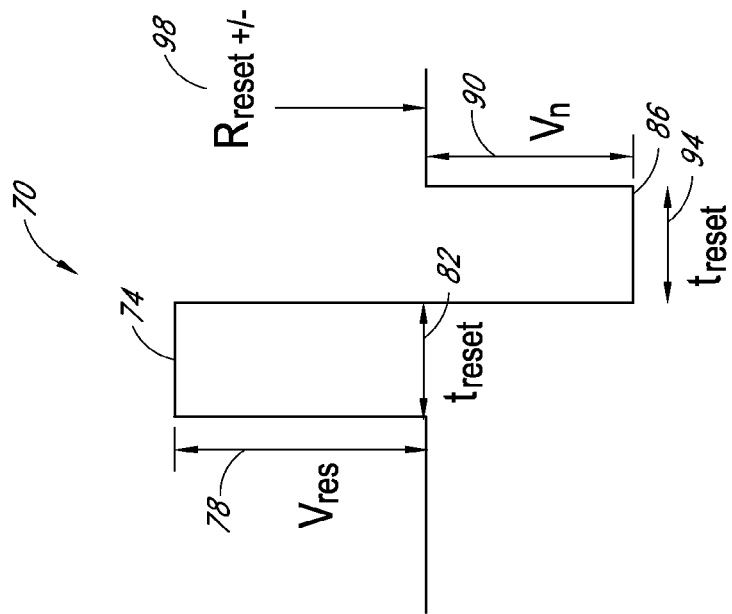
FIG. 3B is a schematic illustration of an electrical pulse for write-accessing a memory cell according to some embodiments.
Figure 3A:
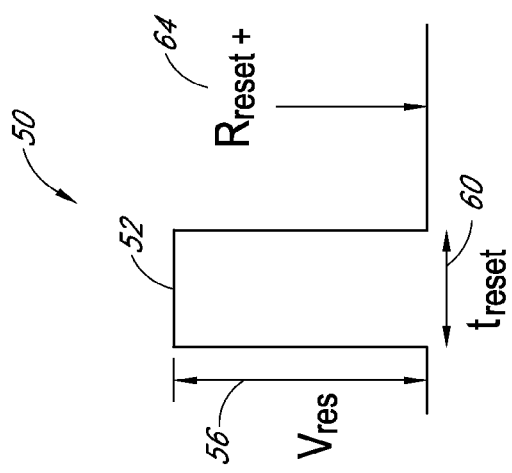
FIG. 3A is a schematic illustration of an electrical pulse for write-accessing a memory cell.

Referring to FIG. 3A, a memory controller may be configured to cause an access operation 50 on a variable resistance memory cell by causing application of a pulse 52 having a first polarity between a first electrode and a second electrode. The illustrated pulse 52 may, for example, be a RESET pulse, and the first polarity may be a positive polarity obtained by placing a positive voltage on the upper electrode (32 in FIG. 2) relative to the lower electrode (40 in FIG. 2). Alternatively the first polarity may be a positive polarity obtained by placing a positive voltage on the column (20 in FIG. 2) relative to the row (22 in FIG. 2) The pulse 52 can have a pulse width 60 ($t_{RESET}$). In the illustrated embodiment the pulse magnitude (Vres) represents the voltage applied across the storage element of the memory cell. However, it will be appreciated that when the pulse is applied across a combination of the storage element and a selector element, the corresponding pulse magnitude 56 (Vres) can be higher by the amount of voltage additionally dropped across the selector element. By way of example only, for a memory cell having a selector element that drops about 1V, the above indicated voltages would be increased by at least by about 1V.

In FIG. 3A, while the pulse 52 is represented as having a pulse magnitude 56 (Vres) that is constant, embodiments are not so limited. It will be appreciated that Vres can be time-varying. In embodiments with time-varying Vres, the pulse magnitude 56 can represent a peak magnitude or an time-averaged magnitude.

Referring to FIG. 3B, a memory controller may be configured to cause a dual-pulse access operation 70 in two successive phases on a variable memory cell according to some embodiments. The dual-pulse access operation 70 includes application of a first pulse 74 during a first phase and a second pulse 86 during a second phase. In FIG. 3B, for illustrative purposes only, no other events are included in the first and second phases except for the first and second pulses 74 and 86, respectively. However, it will be appreciated that other events related to the write operation on the cell can be included in one or both of first and second phases, such as, for example, a thresholding event or a delay, as described more in detail with respect to FIG. 4. The first pulse 74 has a combination of a first polarity, a first pulse width 82 ($t_{RESET}$) and a first pulse magnitude 78 (Vres), chosen to cause the memory cell to undergo a state change. The illustrated first pulse 74 may be a write pulse, and more particularly a RESET pulse, e.g., to place the memory cell in a relatively high resistivity state. The first polarity may be a positive polarity obtained by, for example, placing a positive voltage on the upper electrode (32 in FIG. 2) relative to the lower electrode (40 in FIG. 2). Alternatively the first polarity may be a positive polarity obtained by placing a positive voltage on the column (20 in FIG. 2) relative to the row (22 in FIG. 2). The first pulse 74 can have a first pulse width 82 ($t_{RESET}$) which can be, for example, between about 1 ns and about 1000 ns, between about 10 ns and about 500 ns, or between about 50 ns and about 200 ns, for instance about 100 ns. The first pulse 74 can have a first pulse magnitude 78 (Vres) between about 0.1 V and about 10 V, between about 0.5 V and 5 V, between about 1 V and about 3 V, or between about 1.3 V and 1.8V.

Unlike the memory access operation 50 described above with respect to FIG. 3A, the dual-pulse access operation 70 of FIG. 3B additionally includes, subsequent to the first pulse 74, application of a second pulse 86 having a second polarity, a second pulse magnitude 90 ($V_n$), and a second duration 94 ($t_n$). The second polarity is opposite to the first polarity of the first pulse 74 and in the illustrated embodiment it can be obtained, for example, by placing a negative voltage on the upper electrode (32 in FIG. 2) or the column (20 in FIG. 2) relative to the lower electrode (40 in FIG. 2) or the row (22 in FIG. 2), which may be achieved by reversing the polarities of the first and second electrodes following the first pulse 74.

In some embodiments, the second pulse 86 can have a pulse width 94 ($t_n$) that is similar in range to the pulse width 82 of the first pulse 74. For example, the pulse 86 can have a pulse width 94 which can be, for example, between about 1 ns and about 1000 ns, between about 10 ns and about 500 ns, or between about 50 ns and about 200 ns, for instance about 100 ns.

Unlike the first pulse 74, however, the second pulse 86 has a second pulse magnitude 90 ($V_n$) that is lower than the first pulse magnitude 78. In some embodiments, the second pulse 86 can have a second magnitude 90 ($V_n$) that is less than about 90% of the first pulse magnitude 78, less than about 80% of the first pulse magnitude 78, or less than about 70% of the first pulse magnitude 78. In some other embodiments, the second pulse 86 can have a magnitude 90 ($V_n$) that is between about 10% and about 90% of the first pulse magnitude 78, between about 15% and about 80% of the first pulse magnitude 78, or between about 15% and about 70% of the first pulse magnitude 78.

Similar to the pulse 52 described above with respect to FIG. 3A, in the illustrated embodiment the pulse magnitudes 78 (Vres) and 90 ($V_n$) represent voltages applied across the storage element of the memory cell. However, it will be appreciated that when the pulse is applied across a combination of the storage element and the selector element, the corresponding pulse magnitudes can be higher by the amount of voltage additionally applied across the selector element.

Similar to as described above with respect to FIG. 3A, while the first and second pulses 74 and 86 are represented as having pulse magnitudes 78 (Vres) and 90 ($V_n$), respectively, that are constant, embodiments are not so limited. It will be appreciated that Vres and/or $V_n$ can be time-varying. In embodiments with time-varying Vres and/or $V_n$, the pulse magnitudes 78 and 90 can represent peak magnitudes or time-averaged magnitudes.

Upon completion of the dual-pulse access operation 70, the memory cell may have a resistance value $R_{reset+/-}$ which may be, for example, between about $10^4\Omega$ and about $10^9\Omega$, between about $10^5\Omega$ and about $10^8\Omega$, or between about $10^6\Omega$ and about $10^8\Omega$. In some embodiments, the combination of the various parameters described above, including first and second pulse magnitudes 78 and 90 and first and second pulse widths 82 and 94 can be chosen such that the resulting resistance value 98 ($R_{reset+/-}$) measured after completion of the first and second pulses 74 and 86 is higher than the resistance value ($R_{reset+}$ 64 in FIG. 3A) measured after completion of only the first pulse 74 without applying the second pulse 86, similar to the access operation 50 of FIG. 3A. In the illustrated embodiment, $R_{reset+/-}$ is greater than $R_{reset+}$ by a factor of >=1.5X, >=2.0X, or >=2.5X. It will be appreciated that such an increase in the resistance value of the memory cells that are in RESET states can advantageously provide a higher read window for the memory array. A read window may be defined based on a difference in threshold voltages and/or current values between memory cells in a RESET state and memory cells in a SET state. For example, a memory cell whose threshold voltage greater than a certain voltage and/or a read current lower than a certain level may be associated with the memory cell being in a programmed state (e.g., a RESET state), whereas a threshold voltage less than a certain voltage and/or a read current higher than a certain level may be associated with the memory cell being in an erased state (e.g., a SET state).

In the illustrated embodiment in FIG. 3B, the polarities of the first and second electrodes are switched immediately after application of the first pulse 74 such that the second pulse 86 immediately follows the first pulse. As used herein, an event which occurs "immediately" after a previous event refers to an event that occurs as fast as the device allows within physical constraints of the device which includes, for example, RC delays of the conductive lines and signal delays between various components such as the controller and the driver. In another example, when the memory device includes a transistor as a selection device, the polarities of the first and second electrodes may be switched by reversing the polarities between the source and the drain. Thus, in various embodiments, a peak-to-peak time lapse between a peak amplitude 78 of the first pulse 74 and a peak amplitude 90 of the second pulse 86 that immediately follows the first pulse 74 may be for example, less than about 50 ns, less than about 10 ns, or less than about 5 ns. In other embodiments, a longer delay after application of the first pulse 74 may be introduced during the first phase prior to initiation of the second phase, or after initiation of the second phase prior to application of the second pulse 86. One example of such an embodiment is described below with respect to FIG. 4. When included, the delay may be, for example, between about 1 ns and about 10 ns, between about 10 ns and about 10 µs or between about 100 ns and about 1 µs.

In some variable resistance memory cells, the memory cell may be thresholded prior to being written. For example, when one or both of the storage element and/or the selector element includes a chalcogenide material as described above, the memory cell may first undergo a threshold event at a critical voltage, referred to herein as the threshold voltage ($V_{TH}$), prior to undergoing a state change, e.g., a phase change of the storage element. As used herein, a threshold event refers to an abrupt reduction in voltage followed by a rapid increase in current through the memory cell. Subsequent to the threshold event, the memory cell can remain thresholded so long as a sufficient amount of current, sometimes referred to as the holding current ($I_{HOLD}$), is maintained through the memory cell. In the following embodiment described with respect to FIG. 4, a threshold-switched variable resistance memory cell is assumed, in which the memory cell is first thresholded; i.e., the cell is placed in a low impedance state to that allows sufficient current to pass through the memory cell to enable the various access operations including write and read. The thresholding event itself may be relatively short compared to the overall access times.

Figure 4:
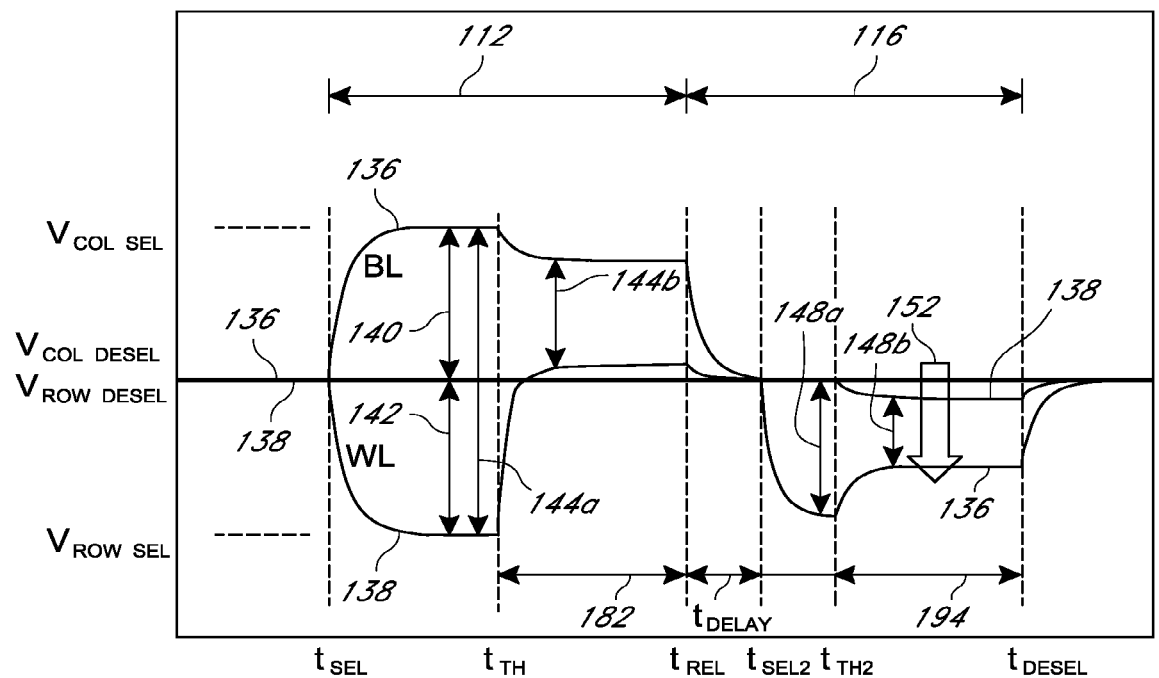
FIG. 4 illustrates voltage-time curves of columns and rows of a memory array illustrating an access operation according to some embodiments.

Referring to FIG. 4, a memory controller may be configured to cause a dual-pulse access operation on a variable resistance memory cell according to some embodiments. In particular, FIG. 4 illustrates voltage-time (V-T) curves corresponding to a RESET access operation of a cross-point memory array performed via a column and a row in which a dual-pulse access operation is performed on a memory cell which includes a threshold switching selector (e.g., OTS). In FIG. 4, V-T curves 136 and 138 represent time evolutions of voltages on a selected column and a selected row, respectively, in which the RESET access operation comprises a first phase 112 which includes application of a first bias 144b (after thresholding), followed by a second phase 116 which includes application a second bias (148b) of opposite polarity.

It will be appreciated that, while in FIG. 4, causing the dual-pulse access operation has been illustrated using voltage-time curves that illustrate time-varying voltages on columns and rows, embodiments disclosed herein are not so limited. Similar results can be obtained using time-varying current magnitudes.

In the illustrated embodiment, the first phase 112 is initiated at a selection time ($t=T_{SEL}$) and the second phase 116 initiates at a release time ($t=t_{REL}$). At time t=0, a plurality of columns and rows of the cross-point memory array, including a column and a row to be selected (e.g., 20S, 22S in FIG. 1) for accessing a target cell (e.g., the T cell in FIG. 1), as well as columns and rows to be inhibited (e.g., for inhibiting the remaining cells, for example, A, B, and C cells in FIG. 1), may be precharged to $V_{COL\ DESEL}$ and $V_{ROW\ DESEL}$.

At $t_{SEL}$, a first selection bias 144a can be applied across the T cell by, for example, applying $V_{COL\ SEL}$ on the selected column as indicated by the V-T curve 136 and applying $V_{ROW\ SEL}$ on the selected row as indicated by the V-T curve 138, which places the T cell under the first selection bias 144a, and as a result, current flows from the selected column through the T cell to the selected row. Under this condition, A cells and B cells may be under inhibit biases 142 and 140, respectively. While in the illustrated embodiment, $V_{COL\ DESEL}$ and $V_{ROW\ DESEL}$ are at substantially the same voltage level such that C cells are essentially under zero bias, it will be appreciated that $V_{COL\ DESEL}$ and $V_{ROW\ DESEL}$ can be at different voltage levels such that C cells have a non-zero bias.

The relative magnitudes of $V_{COL\ SEL}$, $V_{ROW\ SEL}$, $V_{COL\ DESEL}$ and $V_{ROW\ DESEL}$ may be chosen to be at suitable voltages depending on the desired array biasing approach. In some embodiments, a T cell may be subjected to a bias between about 4 V and about 10 V, while type A and B cells may be subjected to about 50% the bias of the T cell, for example between about 2 V and 5 V, and C cells may be subjected to about 0 V.

Still referring to FIG. 4, after a certain amount of time under which the memory cell has been placed under the first selection bias 144a, the T cell may threshold at a threshold time ($t=t_{TH}$). After the T cell thresholds, the bias across the T cell is reduced to a first bias 144b, which may be a bias having a magnitude similar to the first pulse magnitude 78 described above with respect to FIG. 3B. The first bias 144b can have a magnitude between, for example, 0.1 V and about 10 V, between about 0.5 V and 5 V, between about 1 V and about 3 V, or between about 1.3 V and 1.8 V. In addition, the first bias 144b can have a duration 182 as measured between $t_{TH}$ and a release time ($t=t_{REL}$) which can be, for example, between about 1 ns and about 1000 ns, between about 10 ns and about 500 ns, or between about 50 ns and about 200 ns, for instance about 100 ns. At the release time ($t=t_{REL}$), the T cell may be released at least momentarily from the thresholded condition, according to some embodiments.

Subsequently, a second selection bias 148a may be applied across the T cell at a second selection time ($t=t_{SEL2}$) according to some embodiments. According to the illustrated embodiment, there may be a delay ($t_{DELAY}$) between releasing the T cell at $t_{REL}$ from a thresholded condition and applying the second selection bias 148a at $t_{SEL2}$. As explained with respect to the dual-pulse access operation 70 described above with respect to 3B, the duration of $t_{DELAY}$ may be due to physical constraints such as, for example, RC delays of the conductive lines and signal delays between various components such as the controller and the driver, whose duration can be less than about 50 ns, less than about 10 ns, or less than about 5 ns.

Under certain circumstance, once the current passing through a variable resistance memory cell falls below a minimum hold current, the memory cell will no longer be maintained in a thresholded condition. However, the threshold voltage of the memory cell may not immediately return to its original threshold voltage value prior to being thresholded, but may recover the original threshold voltage over a period of time. For example, the threshold voltage may recover within a certain recovery time. In some embodiments, a longer delay $t_{DELAY}$ may be introduced such that the threshold voltage of the memory cell recovers to a particular value after the T cell is released from the thresholded condition. In these embodiments, the second selection bias 148a may be applied within a $t_{DELAY}$ of about 5 microseconds, within about 500 nanoseconds or within about 50 nanoseconds at $t=t_{SEL2}$, from the time of releasing the memory cell at $t_{REL}$. In other embodiments, the $t_{DELAY}$ may be chosen such that the threshold voltage of the memory cell has recovered less than about 90% of its value prior to being thresholded at $t=t_{TH}$, less than about 80% of its value prior to being thresholded at $t=t_{TH}$, or less than about 70% of its value prior to being thresholded at $t=t_{TH}$. The second selection bias 148a illustrated in FIG. 4 may correspond to the reduced threshold value particularly chosen.

Still referring to FIG. 4, after a certain amount of time under which the memory cell has been placed under the second selection bias 148a, the T cell may threshold for a second time at a second threshold time ($t=t_{TH2}$). The second selection bias 148a may be lower in magnitude than the first selection bias 144a, depending on the length of the delay $t_{DELAY}$ as described above.

After the T cell thresholds for the second time at $t=t_{TH2}$, the bias across the T cell may be reduced to a second bias 148b. The second bias 148b can have a second duration 194 that is similar to the second duration 94 described above with respect to FIG. 3B. The second bias 148b can have a second bias magnitude that is lower than the magnitude of the first bias 144b. In some embodiments, the second bias 148b can have a magnitude that is less than about 90%, less than about 80%, or less than about 70% of the first bias 144b. In some other embodiments, the second bias 148b can have a magnitude that is between about 20% and about 90%, between about 30% and about 80%, or between about 40% and about 70% of the first bias 144b.

In some embodiments, when the second bias 148b is applied prior to a significant threshold recovery (e.g., a $t_{DELAY}=0$) of the variable resistance memory cell, a second selection bias of 148a that is greater in magnitude than a subsequent second bias 148b can be avoided. In these embodiments (e.g., $t_{DELAY}=0$), the second bias 148b can be applied directly after $t=t_{SEL2}$ instead of after $t=t_{TH2}$, as illustrated in FIG. 4, thereby avoiding a second selection bias 148a for causing the second threshold event at $t_{TH2}$.

In addition, in other embodiments (not shown), a second selection bias 148a and/or a second bias 148b may be applied at $t=t_{TH2}$, which may be less than the threshold voltage that the variable resistance memory cell may have recovered to at $t=t_{TH2}$. In these embodiments, the second selection bias 148a and/or the second bias 148b that is applied may be insufficient to induce the second threshold event at $t_{TH2}$ while still being effective at achieving the beneficial effects described herein.

Still referring to FIG. 4, subsequently, at a deselection time $t=t_{DESEL}$, the selected column and the selected row may be returned to the precharging condition, $V_{COL\ DESEL}$ and $V_{ROW\ DESEL}$, respectively, to complete the RESET access operation.

It will be appreciated that the direction of the bias and the resulting direction of current flow are reversed between the first selection bias 144a/first bias 144b (i.e., the first phase 112) and the second selection bias 148a/second bias 148b (i.e., the second phase 116). During application of the first selection bias 144a/first bias 144b, the selected column is at a higher voltage relative to the selected row such that the current flows from the selected column to the selected row. On the other hand, during application of the second selection bias 148a/second bias 148b, the selected column is at a lower voltage relative to the selected row such that the current flow (as indicated by the arrow 152) is from the selected row to the selected column. The inventors have found that such reversal of the bias and the current minimizes the net atom migration that can occur during the overall operation of accessing the memory cell, as described above.

Figure 5B:
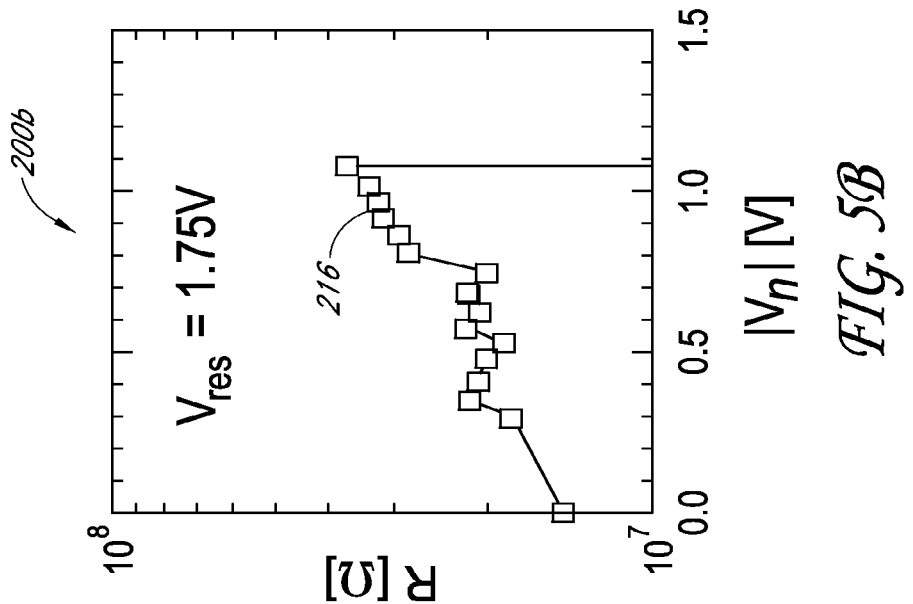
FIG. 5B is an enlarged view of a portion of one of the curves from FIG. 5A.
Figure 5A:
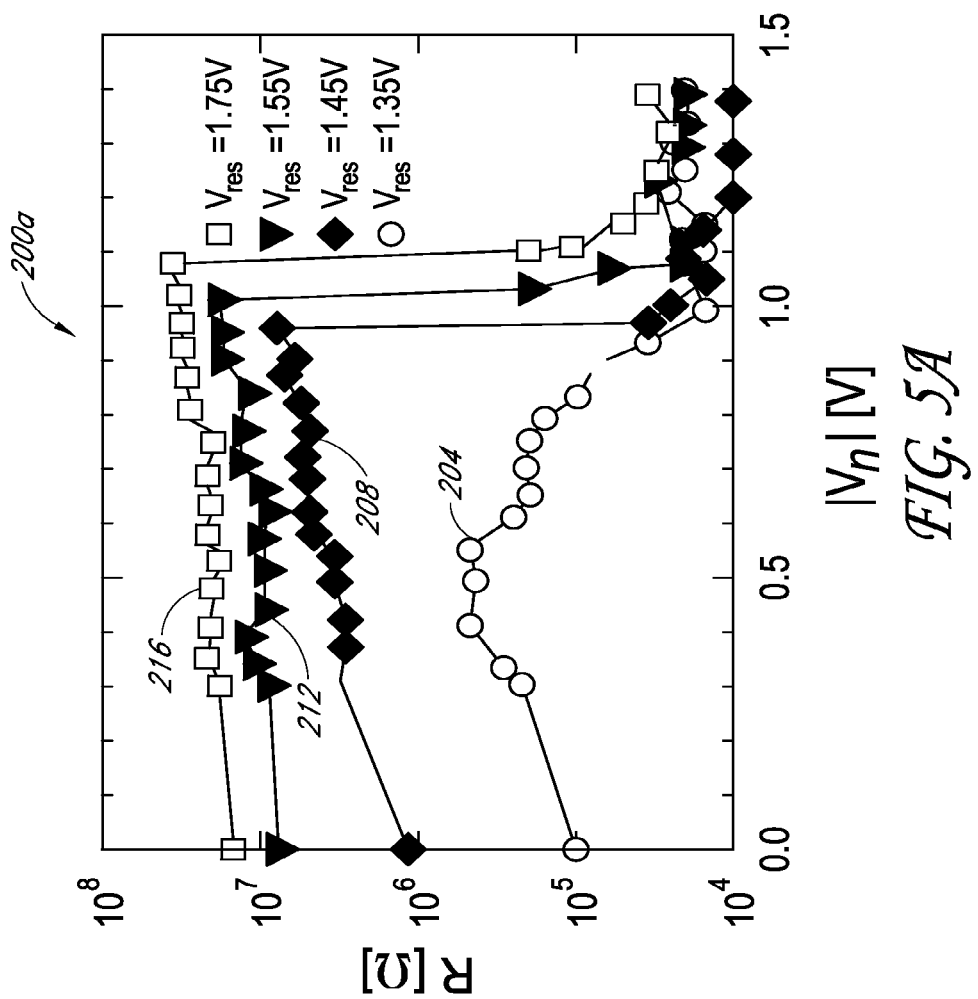
FIG. 5A is a graph of resistance values of a memory cell measured after performing access operations at different voltages, according to some embodiments.

FIGS. 5A and 5B shows graphs 200a and 200b illustrating resistance values of a phase change memory cell measured after performing a dual-pulse RESET access operation, including applying a first pulse and a second pulse having an opposite polarity from the first pulse, according to some embodiments. In graphs 200a and 200b, the y-axes represent measured resistance values across a storage element of the memory cell and the x-axes represent the magnitude of the second pulse. In graph 200a, curves 204, 208, 212 and 216 represent resistance value curves of a memory cell that has received first pulses having magnitudes of 1.35 V, 1.45 V, 1.55 V and 1.75 V, respectively, after having further received second pulses having magnitudes indicated in the x-axis. The resistance values are measured within about 10 seconds or less and at a voltage of about 100 mV across the storage element. Graph 200b is an expanded view of the curve 216, showing a portion of the curve between $10^7 \Omega$ and $10^8 \Omega$. As illustrated, all curves 204, 208, 212 and 216 show increasing resistance values as a function of the magnitude of the second pulse up to a peak value, followed by a decreasing resistance values at higher magnitudes of the second pulse. For example, referring to the curve 216, the resistance of a memory cell that has received a first pulse of 1.75 V increases in value after receiving second pulses having second magnitudes up to about 1.1 V, above which the resistance of the memory cell abruptly drops below $10^6 \Omega$. Thus, the curves of FIG. 5A demonstrate that, when the second pulse magnitude remains below this value, the resistance value of the RESET (HRS) state after having received the second pulse is higher compared to the resistance of the RESET state after having received only the first pulse (corresponding to resistance values at the y intercept). It will be appreciated that higher resistance of the memory cells in the RESET state can result in proportionally higher threshold voltages of the memory cells in the RESET state ($V_{TH\ RESET}$). Assuming that the threshold voltages of the memory cells in the SET state ($V_{TH\ SET}$) do not proportionally increase with the magnitude of the second pulse, a memory read window of a memory array, which can be defined as ($V_{TH\ RESET\ MIN} - V_{TH\ SET\ MAX}$), can be increased using the dual-pulse RESET access, compared to a memory array in which RESET access is performed using only a single-pulse access.

Figure 6:
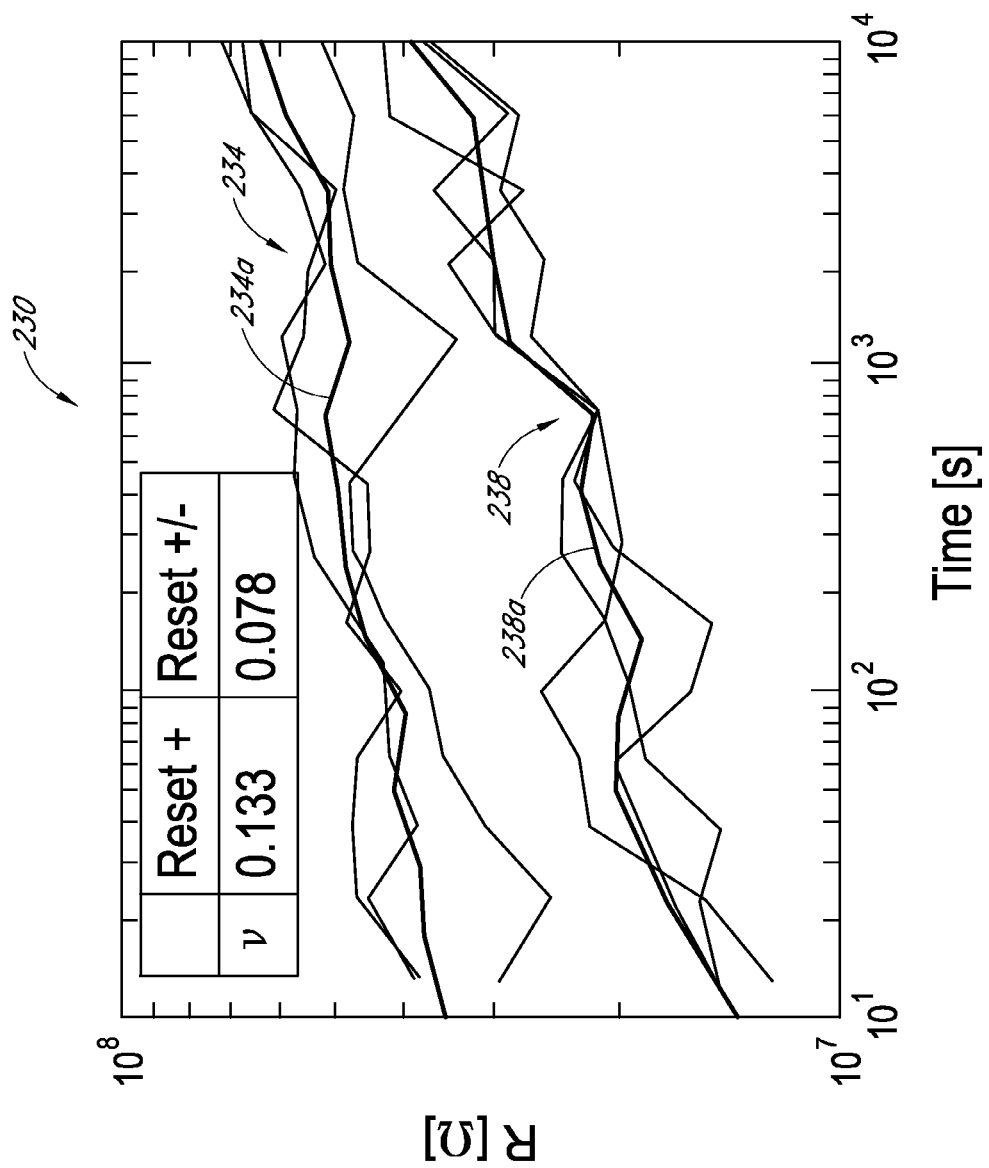
FIG. 6 is a graph illustrating drift in resistance values of a memory cell over time after being written using a single phase and a dual phase access operation, according to some embodiments.

FIG. 6 is a graph 230 showing measured resistance drift characteristics of phase change memory cells over time, according to some embodiments. Resistance drift of a phase change memory cell describes a phenomenon in which the resistance of the state of a phase change memory changes, e.g., increases, over time after undergoing a transition to that state. In the examples provided herein, resistance drift is measured after a RESET transition. Without being bound to any theory, it has been suggested that such resistance drift is related to structural relaxation of, or a short-range atomic rearrangement of, the amorphous phase of a chalcogenide material. The resistance drift can be represented by a power law:

$$R(t) = R_o \exp\left(\frac{t}{t_o}\right)^v \quad [1]$$

In Eq. [1], $R_o$ is a resistance of a phase change memory cell measured at an initial time $t_o$, R(t) is a resistance measured after an elapsed time t from $t_o$, and v is a drift coefficient. In FIG. 6, the y-axis represents the measured resistance at time t, represented in the x-axis as the amount of time lapsed after performing a RESET operation. The graph 230 illustrates an average resistance drift curve 238a, which represents an averaged curve of three resistance drift curves 238 measured on a memory cell comprising a chalcogenide-based storage element at various times after performing a RESET access operation using a single pulse (Reset+) similar to the access operation 50 described above with respect to FIG. 3A. In comparison, the graph 230 additionally illustrates an average resistance drift curve 234a, which represents an averaged curve of three resistance drift curves 234 measured on a memory cell comprising a chalcogenide-based storage element at various times after performing a dual-pulse RESET access operation using first and second pulses (Reset +/−) similar to the dual-pulse access operation 70 described above with respect to FIG. 3B. The graph 230 demonstrates, among other things, that the rate of drift, represented by the drift coefficient v defined in Equation [1] above, for a memory cell that has received a dual-pulse RESET access operation (Reset +/−) is significantly lower compared to the rate of drift of a memory cell that has received a single pulse RESET access operation (Reset +).

Figure 7:
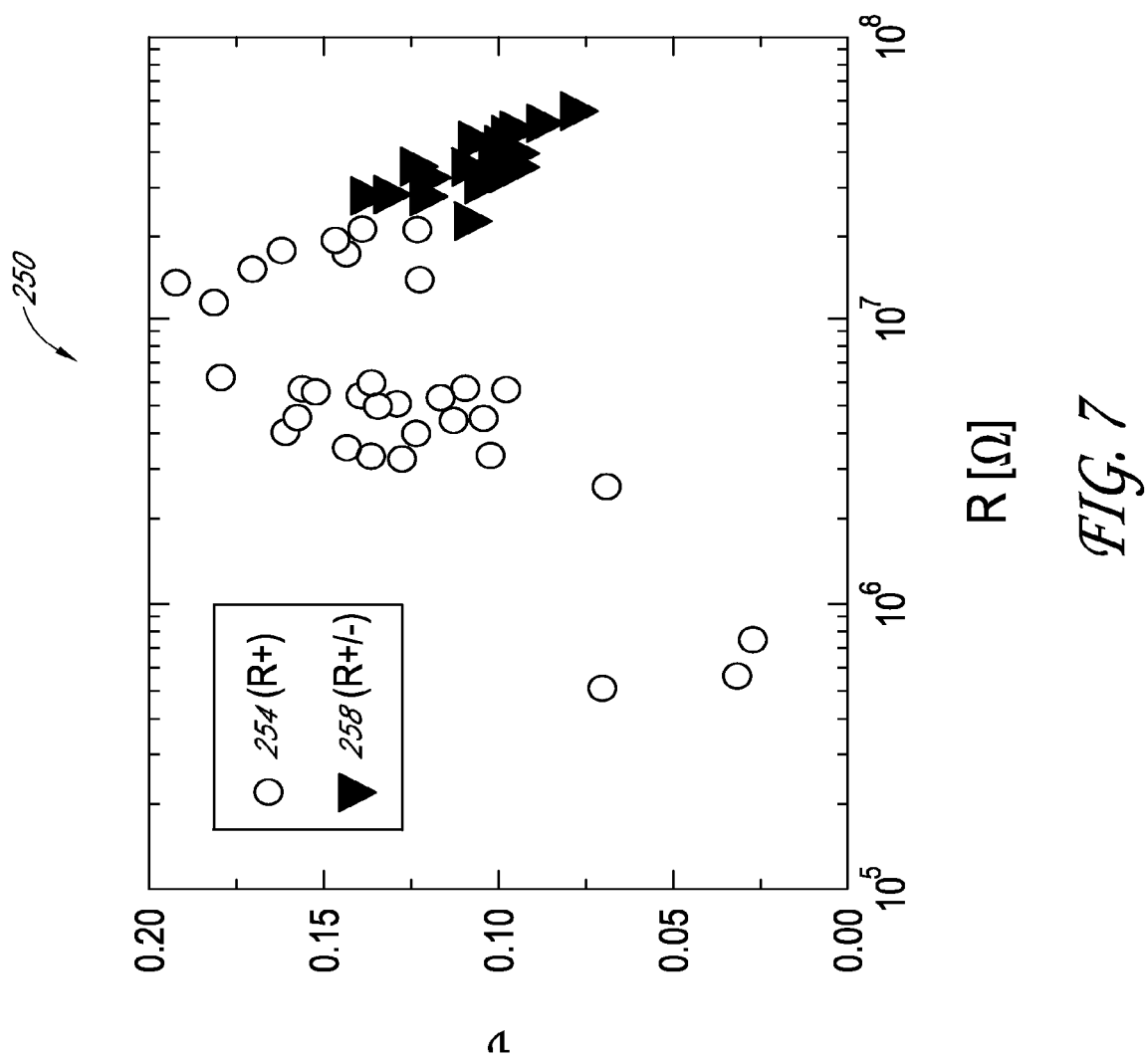
FIG. 7 is a graph of drift in resistance values of a memory cell as a function of resistance, according to some embodiments.

FIG. 7 is a graph 250 showing measured resistance drift of a memory cell as a function of measured resistance, according to some embodiments. In FIG. 7, the y-axis represents measured drift coefficients for a memory cell as described above with respect to Eq. [1], obtained after RESET accessing the memory cell to various RESET resistance levels. The measurements of the various RESET resistance levels are plotted in the x-axis and represent the resistance values of the memory cell measured within about 10 seconds performing the RESET operation. In particular, the graph 250 illustrates data points 254 (R+) representing drift measurements made on a memory cell comprising a chalcogenide-based storage element after performing RESET access operations to various resistance levels using a single pulse, similar to the access operation 50 described above with respect to FIG. 3A. In comparison, the graph 250 additionally illustrates data points 258 (R+/−) representing drift measurements made on a memory cell comprising a chalcogenide-based storage element after performing RESET access operations to various resistance levels using a dual-pulse RESET access operation using first and second pulses similar to the dual-pulse access operation 70 described above with respect to FIG. 3B. The graph 250 demonstrates, among other things, that for a given rate of drift, the as-RESET resistance values of a memory cell that has received a dual-pulse RESET access operation (Reset +/−) is higher (by as much as more than a decade). Furthermore, the rate of drift is on average lower for the cells programmed with dual-pulse RESET operations, as compared to single pulse RESET operations.

Thus, based on the foregoing, apparatuses and methods of increasing the read window and/or improving the stability of the threshold voltage/read current has been described. Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

The invention claimed is:

1. An apparatus comprising:
a memory cell comprising a chalcogenide material; and
a memory controller configured to initiate a dual pulse for a single operation by:
applying a first pulse having a positive polarity and a first bias and a second bias different from the first bias, wherein the memory cell is in a reset state after application of the first pulse having the positive polarity; and
applying a second pulse having a magnitude lower than a magnitude of the first pulse and having a third bias and a fourth bias different from the third bias, wherein the memory cell is in the reset state after application of the second pulse.

2. The apparatus of claim 1, wherein the memory controller is configured to increase a resistance of the memory cell from a low resistance state in a set state to a high resistance state in the reset state based at least in part on applying the first pulse.

3. The apparatus of claim 1, wherein the memory controller is configured to apply the first pulse while the memory cell is in a set state.

4. The apparatus of claim 1, wherein the memory controller is further configured to apply the second pulse having a negative polarity by reversing the polarities of the first and second electrodes following the first pulse.

5. The apparatus of claim 1, wherein the first bias is higher than the second bias, and wherein the third bias is higher than the fourth bias.

6. The apparatus of claim 1, wherein the memory cell is configured to remain in the reset state after application of the first pulse and during application of the second pulse.

7. The apparatus of claim 1, wherein the memory controller is configured to change the chalcogenide material from a first phase to a second phase based at least in part on applying the first pulse.

8. The apparatus of claim 1, wherein the single operation is a RESET operation.

9. The apparatus of claim 1, wherein the memory cell comprises at least one of a storage element or a selector element.

10. The apparatus of claim 1, wherein the memory cell comprises a first electrode and a second electrode, and wherein the memory controller is configured to apply the first pulse with the positive polarity and to apply the second pulse with a negative polarity.

11. A method comprising:
accessing a memory cell comprising a chalcogenide material;
applying a dual pulse to perform a single access operation, wherein applying the dual pulse comprises:
applying a first pulse having a positive polarity and a first bias and a second bias different from the first bias, wherein the memory cell is in a reset state after application of the first pulse having the positive polarity; and
applying a second pulse having a magnitude lower than a magnitude of the first pulse and having a third bias and a fourth bias different from the third bias, wherein the memory cell is in the reset state after application of the second pulse.

12. The method of claim 11, further comprising:
increasing a resistance of the memory cell from a low resistance state in a set state to a high resistance state in the reset state based at least in part on applying the first pulse.

13. The method of claim 11, further comprising:
applying the second pulse immediately after the first pulse.

14. The method of claim 11, further comprising:
maintaining the memory cell in the reset state after application of the first pulse and during application of the second pulse.

15. The method of claim 11, wherein applying the first pulse comprises:
initiating a phase change of the chalcogenide material from a first phase to a second phase that is different from the first phase.

16. The method of claim 11, wherein the first bias is higher than the second bias, and wherein the third bias is higher than the fourth bias.

17. The method of claim 11, wherein applying the first pulse comprises applying the first pulse with the positive polarity between a first electrode and a second electrode;
the method further comprising reversing the polarities of the first electrode and the second electrode after applying the first pulse, wherein applying the second pulse comprises applying the second pulse with a negative polarity.

* * * * *